(12) United States Patent
Thom et al.

(10) Patent No.: US 11,989,376 B2
(45) Date of Patent: May 21, 2024

(54) DETECTOR SYSTEM

(71) Applicant: Carl Zeiss Jena GmbH, Jena (DE)

(72) Inventors: Martin Thom, Jena (DE); Marc Junghans, Jena (DE); Roman Kleindienst, Jena (DE); Mirko Riethmueller, Jena (DE)

(73) Assignee: Carl Zeiss Jena GmbH, Jena (DE)

( * ) Notice: Subject to any disclaimer, the term of this patent is extended or adjusted under 35 U.S.C. 154(b) by 0 days.

(21) Appl. No.: 18/018,559

(22) PCT Filed: Jun. 24, 2021

(86) PCT No.: PCT/EP2021/067330
§ 371 (c)(1),
(2) Date: Jan. 28, 2023

(87) PCT Pub. No.: WO2022/022903
PCT Pub. Date: Feb. 3, 2022

(65) Prior Publication Data
US 2023/0297192 A1 Sep. 21, 2023

(30) Foreign Application Priority Data
Jul. 30, 2020 (DE) .......................... 102020120158.3

(51) Int. Cl.
*G09G 5/00* (2006.01)
*G02B 6/42* (2006.01)
*G06F 3/042* (2006.01)

(52) U.S. Cl.
CPC ............. *G06F 3/0421* (2013.01); *G02B 6/42* (2013.01); *G02B 6/4206* (2013.01); *G06F 2203/04101* (2013.01)

(58) Field of Classification Search
CPC . G06F 3/042; G06F 2203/04101; G02B 6/42; G02B 6/4206

(Continued)

(56) References Cited

U.S. PATENT DOCUMENTS

2011/0248960 A1 10/2011 Gruhlke
2012/0001833 A1 1/2012 Lindig et al.
(Continued)

FOREIGN PATENT DOCUMENTS

| DE | 102010041348 A1 | 3/2012 | |
| DE | 102018209305 | * 12/2019 | ............. G06F 3/042 |
| DE | 102018209305 A1 | 12/2019 | |

OTHER PUBLICATIONS

International Search Report rendered by the International Bureau of WIPO for PCT/EP2021/067330, dated Oct. 21, 2021, 2 pages.

(Continued)

*Primary Examiner* — Jennifer T Nguyen
(74) *Attorney, Agent, or Firm* — Skaar Ulbrich Macari, P.A.

(57) ABSTRACT

In a base element of a waveguide for a detector system at least one portion of radiation passing via the front side and impinging on a diffractive element in the display region is deflected via the diffractive element according to the selection region. The deflected portion is propagated as coupled-in radiation via reflection to an out-coupling region and impinges on the associated out-coupling section of the out-coupling region. The portion of radiation coupled out by an out-coupling section impinges on an associated sensor section of the sensor unit, which continuously measures the intensity of the impinging radiation and supplies the control unit, wherein, according to a change of intensity, which is dependent on positioning an object in front of the front side of the base element and in front of a selection region of the display region, the control unit determines whether the one selection region has been selected.

13 Claims, 8 Drawing Sheets

(58) Field of Classification Search
USPC .......................................................... 345/156
See application file for complete search history.

(56) References Cited

U.S. PATENT DOCUMENTS

| | | |
|---|---|---|
| 2013/0181896 A1 | 7/2013 | Gruhlke et al. |
| 2014/0192023 A1 | 7/2014 | Hoffman |
| 2015/0103051 A1 | 4/2015 | Wyrwas et al. |
| 2015/0138144 A1* | 5/2015 | Tanabe ............... G06F 3/0416 |
| | | 345/174 |
| 2017/0255813 A1* | 9/2017 | Chen ............... G06V 40/1324 |
| 2018/0172995 A1* | 6/2018 | Lee ..................... G02B 6/0016 |
| 2019/0107922 A1 | 4/2019 | Dearn et al. |
| 2020/0033190 A1 | 1/2020 | Popovich et al. |
| 2020/0089319 A1 | 3/2020 | Popovich et al. |
| 2020/0192279 A1 | 6/2020 | Kim et al. |
| 2020/0271928 A1 | 8/2020 | Schwartze et al. |

OTHER PUBLICATIONS

International Preliminary Report on Patentability rendered by the International Bureau of WIPO for PCT/EP2021/067330, dated Jan. 31, 2023, 8 pages.

\* cited by examiner

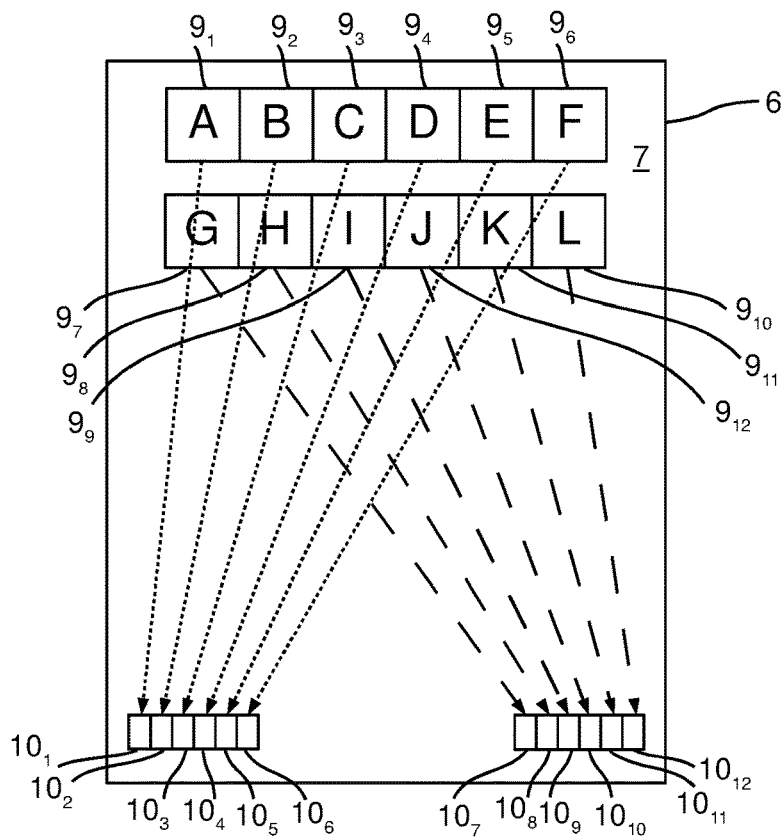
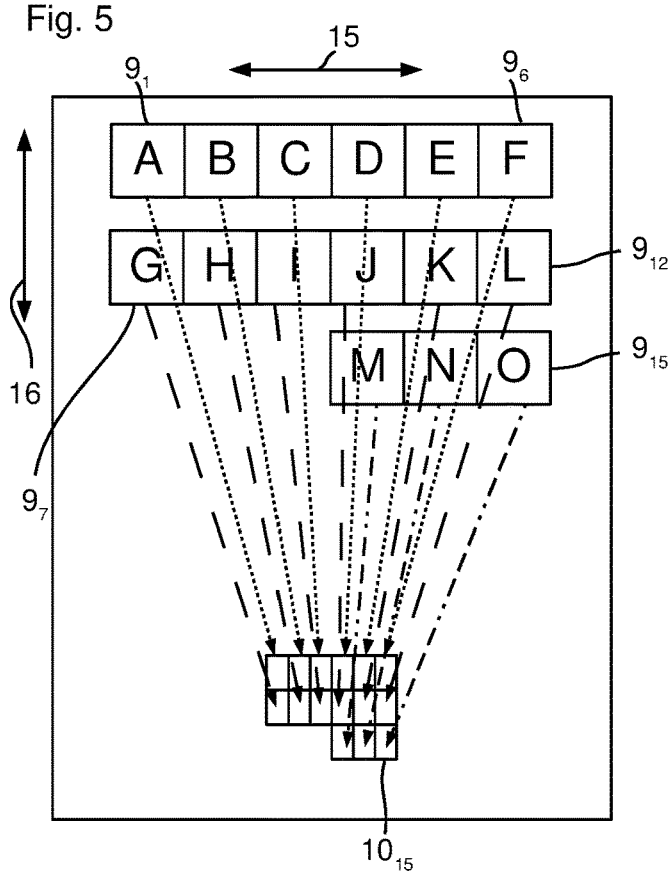
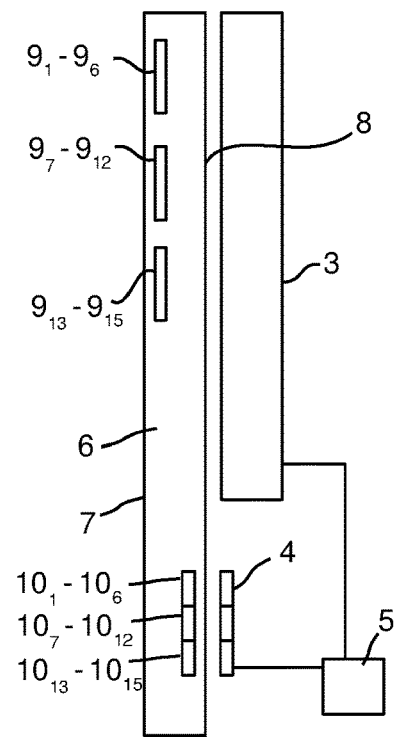

DETECTOR SYSTEM

PRIORITY

This application claims the priority of German patent application DE 10 2020 120 158.3 filed Jul. 30, 2020, which is hereby incorporated herein by reference in its entirety.

FIELD

The present invention relates to a detector system for a display apparatus, the detector system providing a contactless input interface.

BACKGROUND

Nowadays, display devices are often provided in such a way that their surface can be used to make inputs. This functionality is generally known as a "touchscreen" and is used to improve the usability of the display device. Furthermore, additional human-machine interfaces (HMIs), such as a mouse or keyboard, can be dispensed with. Touchscreen technology is now widespread and is installed, for example, in laptops, point of sale systems, smartphones or multifunction displays in vehicles.

There are currently three common solutions for touchscreens. There are resistive touchscreens, where the display reacts to pressure or resistance. The pressure point is recorded by a resistor matrix, processed in the controller and interpreted by the operating system as an input.

In the case of inductive touchscreens, these are usually operated using a stylus having a coil incorporated in its head. A network containing conductor tracks on the display induces current in the coil of the stylus. The stylus transmits a signal that is used to detect the exact position. The stylus itself does not have to touch the surface of the touchscreen for this.

In the case of capacitive touchscreens, the display can be operated using any conductive objects. Capacitive touchscreens such as these are currently installed in almost all new smartphones. Capacitive touchscreens such as these have a lattice of conductor tracks incorporated in the glass layers. Touching the display surface changes the electric field. The point of contact can be deduced from changes in capacitance in the lattice. Capacitive touchscreens have multi-touch capability. This means that more than one point of contact can be detected and processed at the same time.

A trend towards augmented reality can still be seen in graphics applications. This is understood to mean in particular the computer-aided expansion of the perception of reality. This involves information (e.g. image content, virtual objects) being visually represented by being superimposed and/or overlaid in the real image. Efforts are currently being made to develop operating concepts for augmented reality solutions. The control/input is currently based on three main approaches.

Gesture recognition can be carried out in this way. This involves using systems having external sensors in order to recognize human gestures and to be able to interpret them with the aid of computers. The most commonly used methods are camera-based gesture recognition, ultrasound-based gesture recognition, LIDAR (Light Detection and Ranging) and RADAR (Radio Detection and Ranging).

Camera-based gesture recognition uses one or more cameras to record images of the gestures. These are then compared with a database, and interpreted, using a piece of software (descriptor). These cameras can work with different technologies, such as time-of-flight, structured light or stereoscopy.

In the case of ultrasound-based gesture recognition, a microchip generates high-frequency sound waves, which are reflected by an object. The reflected waves can then be captured again by the chip. The position and direction of movement can be detected by way of travel time, phase shift and/or frequency shift.

In the case of the LIDAR method, the distances are measured by measuring the travel times of transmitted light signals. With the RADAR method, distance and direction are determined based on the measurement of the travel time of electromagnetic waves transmitted and reflected by the object.

Furthermore, a widely used method to control graphical augmented reality solutions is to use an HMI (Human-Machine Interface). The ring with joystick "loop" of smart glasses "focals" can be given as an example. The interface forwards the commands entered by the user to the operating system for processing.

Furthermore, voice control can be carried out. Here, voice commands are transferred to a module that can record and interpret the spoken input.

However, the current operating concepts mentioned above have some disadvantages.

With the touchscreen technology solutions, the display gets dirty when the display surface is touched, which can impair functionality. There are also hygiene problems, especially in public spaces (e.g. in restaurants) or in medical facilities. Furthermore, scratches on the display surface can cause malfunctions during operation. With the capacitive solution, the input must come from a conductive object. This is awkward or impossible e.g. when wearing gloves.

Liquids on the surface can also interfere with operating behavior. The resistive solution requires the surface to be made of elastic material (e.g. plastic), which makes the display easily prone to scratches. The inductive solution requires its own HMI device (e.g. stylus).

The problem with augmented reality control is that voice controls work only for the stored languages and are susceptible to interference from background noise. Input using an HMI requires as mandatory an additional device, the HMI itself. Gesture recognition is effective only for certain lighting conditions and depends on the resolution of the camera and the computing power of the computer system.

SUMMARY

An object of the invention to provide a detector system having an improved input interface.

The detector system according to certain example embodiments can comprise a waveguide that comprises a transparent base body having a front and a rear, a display device that shows multiple selection regions in such a way that they can be seen in a display region of the base body when the front is viewed, a sensor device that comprises an assigned sensor section for each selection region, and a control device. The base body can include a diffractive element in the display region and a decoupling region that is spaced apart from the display region and comprises an assigned decoupling section for each selection region. At least a portion of radiation that is incident on the diffractive element in the display region via the front can be deflected by means of the diffractive element on the basis of the selection region in such a way that the deflected portion propagates as coupled-in radiation in the base body by reflection (or by reflections) as far as the decoupling region and is incident on the assigned decoupling section, wherein the decoupling region decouples at least a portion of the coupled-in radiation that is incident on it from the base body in such a way that the portion decoupled by a decoupling section is incident on the assigned sensor section of the sensor device, which section continuously measures the intensity of the incident radiation and supplies it to the control device. The control device can take a change in intensity caused by an object being positioned in front of the front of the base body and in front of a selection region of the display region as a basis for determining whether the selection region has been selected.

The measured intensity change can thus be used to determine whether and, if so, which of the selection regions of the display region has been selected.

With the present solution, the approach of an object (for example a finger or a hand) toward the selection region can thus cause a change in the light intensity in this region. This brings about a change in the light intensity on the assigned sensor section. For example the voltage change on the sensor can thus be used to interpret the exact location of the input on the display device and/or the distance of the object from the front of the base body. It is advantageous if both the diffractive element in the display region and the decoupling section are in the form of a volume hologram embedded in the base body, which act as coupling and decoupling gratings. Together with the base body, the holograms form a holographic waveguide. Light of a specific wavelength, or spectral bandwidth, or light with a specific angle, or angle range, can be guided from the coupling grating to the decoupling grating in said waveguide. Guidance within the base body is preferably produced by total internal reflection at the front and rear at a deflection angle determined by the volume hologram.

The detector system according to certain example embodiments can be used to provide a contactless area sensor and to provide or improve the following new applications, for example. Integration of a visualization behind a pane (e.g. shop window) is possible, which can also be interacted with from a short distance. A transparent, partially transparent or opaque display can be created and operated, in which the content (selection region) is displayed in front of, in or behind the display plane. An improvement in input recognition and ergonomics compared to other gesture-recognizing camera solutions is achieved.

Furthermore, operation using objects of all kinds (conductive or nonconductive) is possible. There is low susceptibility to interference in different lighting conditions and no database is required, as is the case with voice input, for example. There is also a wide range of options for the material of the transparent base body. This is a purely optical system on the surface, and so various functional layers (e.g. with laser engravings, wires, etc.) are not necessary on the surface. The front of the base body also does not become dirty as a result of operation, since operation is contactless.

The display device can be spaced apart from or connected to the transparent base body. Furthermore, the base body can be incorporated in the display device itself. The display device can be in the form of an active display device or in the form of a passive display device.

The diffractive element in the display region can be buried in the transparent base body. The diffractive element is preferably in the form of a volume hologram. Of course, the diffractive element can also be in the form of a two-dimensional grating. It can be buried in the base body or formed on the front or on the rear. The diffractive element can also be a relief grating.

The same applies to the decoupling region. The decoupling region can comprise a diffractive element. The diffractive element of the decoupling region can be developed in the same way as the diffractive element of the display region. It is particularly preferred if a volume hologram is formed both in the display region and in the decoupling region.

The transparent base body is preferably in the form of a plane-parallel plate and can be made of plastic or glass. However, it is also possible for the front and/or the rear of the transparent base body to be curved. It is also possible for the front and rear to be planar, but not run parallel to one another, so that the transparent base body comprises a wedge shape.

The decoupling region can be designed in such a way that it decouples the radiation via the front, the rear or the end of the transparent base body.

The selection regions can be arranged next to one another (at a distance or directly adjacent) in a first direction. Furthermore, the selection regions can be arranged next to one another, directly adjacent or at a distance from one another in a second direction, which is different from the first direction.

The same applies to the decoupling sections of the decoupling region.

The lens element function of the diffractive element can be designed in such a way that a separate lens element function is provided for each selection region. The focal points of these lens element functions preferably lie in a focal plane that is in particular in front of the front.

Furthermore, the lens element function of the decoupling region can be designed in such a way that each decoupling section comprises a lens element function. The focal points of these provided lens element functions preferably lie in the plane of the sensor device.

In particular, the illumination device can be designed in such a way that there is provision for a diffractive element for decoupling illumination radiation in the region of the selection regions.

The diffractive element in the region of at least one selection region and/or at least one decoupling section (preferably the assigned decoupling section) can comprise a wavelength-dependent imaging property having a longitudinal chromatic aberration. This is understood to mean that the position of the focal points along the optical axis of the imaging property is different for different wavelengths. The sensor device can measure the intensity of the incident beams as a function of wavelength and supply it to the control device, the control device taking the measured wavelength-dependent intensity as a basis for determining the distance of the object from the front of the base body.

In particular, the detector system is designed in such a way that only distances greater than zero are measured, or detected, in order to allow contactless distance detection.

The control device can take the determined distance as a basis for changing the value of a measurement parameter and/or output parameter or another parameter. This can be e.g. the volume of an audio output, the brightness of a display, the sensitivity of a measured variable or something else. Measuring the distance advantageously allows the magnitude of a value to be for example continuously adjusted, or set, in a simple manner.

Such adjustment (preferably continuous adjustment) of a parameter can also be implemented by designing the multiple selection regions as different magnitudes of the parameter, so that magnitude adjustment is carried out in the manner of a slider by moving the object over the selection regions.

It goes without saying that the features mentioned above and the features yet to be explained below can be used not only in the specified combinations but also in other combinations or on their own without departing from the scope of the present invention.

The invention is explained in more detail below on the basis of exemplary embodiments with reference to the accompanying drawings, which also disclose features that are essential to the invention. These exemplary embodiments are provided for illustration only and should not be construed as limiting. For example, a description of an exemplary embodiment having a multiplicity of elements or components should not be construed as meaning that all of these elements or components are necessary for implementation. Rather, other exemplary embodiments may also contain alternative elements and components, fewer elements or components, or additional elements or components. Elements or components of different exemplary embodiments can be combined with one another, unless indicated otherwise. Modifications and variations that are described for one of the exemplary embodiments can also be applicable to other exemplary embodiments. In order to avoid repetition, elements that are the same or correspond to one another in different figures are denoted by the same reference signs and are not explained repeatedly.

BRIEF DESCRIPTION OF THE DRAWINGS

FIG. 4 shows a view of the front of a further base body 6 according to a further embodiment of the detector system 1;

FIG. 5 shows a view of the front 7 of a further embodiment of the base body 6 of a further detector system 1;

FIG. 6 shows a side view of the detector system 1 of FIG. 5;

DETAILED DESCRIPTION

Figure 1:
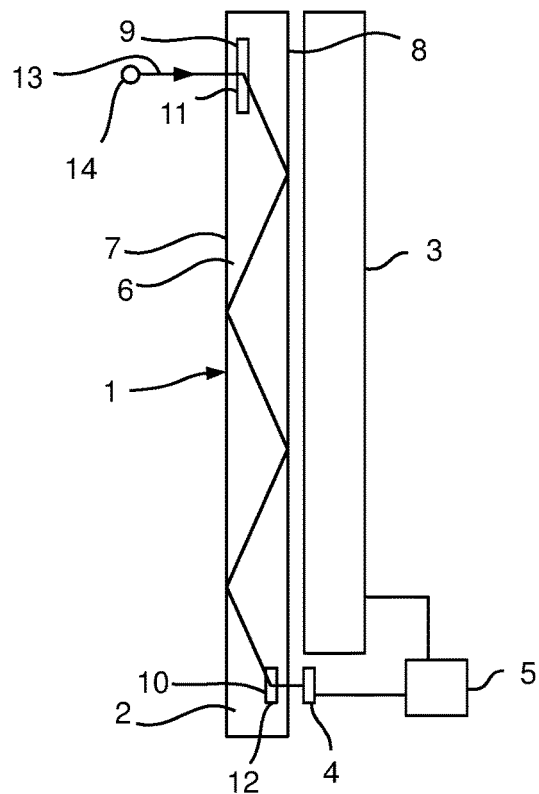
FIG. 1 shows a schematic representation of an embodiment of the detector system.

In the embodiment shown in FIG. 1, the detector system 1 includes a waveguide 2, a display device 3, a sensor device 4 and a control device 5.

The waveguide comprises a transparent base body 6 having a front 7 and a rear 8. In the exemplary embodiment described here, the base body 6 is in the form of a plane-parallel plate, which means that both the front 7 and the rear 8 are flat. The base body 6 can be made of glass or plastic, for example.

The base body 6 comprises a coupling region 9 and a decoupling region 10 spaced apart therefrom, a volume hologram 11, 12 being formed both in the coupling region 9 and in the decoupling region 10.

As shown schematically in FIG. 1, at least a portion of a radiation 13 that enters the transparent base body 6 via the front 7 and is incident on the volume hologram 11 of the coupling region 9 is deflected by means of the volume hologram 11 in such a way that the deflected portion is guided as coupled-in radiation by reflections on the rear 8 and the front 7 as far as the volume hologram 12 of the decoupling region 11. The reflections on the rear 8 and the front 7 can be total internal reflections. However, it is also possible for the front 7 and the rear 8 to have a partially reflective or reflective coating at least in the region for guiding the coupled-in radiation.

At least a portion of the coupled-in radiation that is incident on the volume hologram 12 of the decoupling region 10 is deflected by means of the volume hologram 12 in such a way that said portion emerges from the transparent base body 6 via the rear 8 and is incident on the sensor device 4 positioned behind the rear 8.

Figure 2:
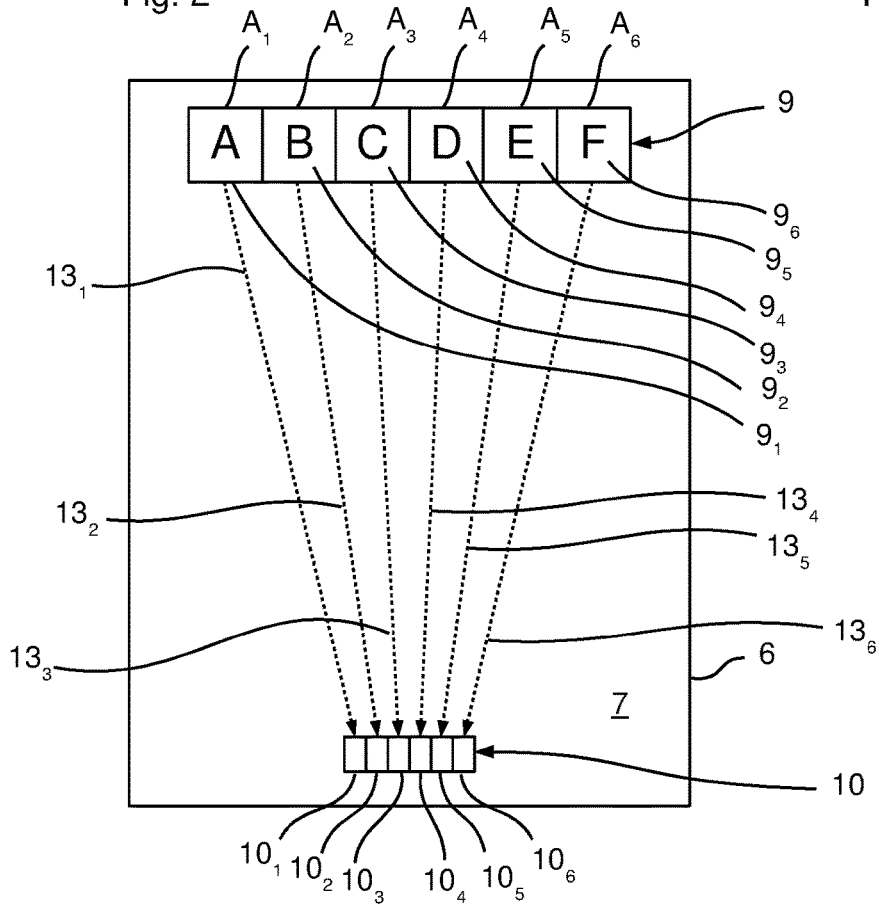
FIG. 2 shows a view of the front 7 of the base body 6 of the detector system 1 in FIG. 1.

The display device 3, which can be e.g. an LCD display, is also arranged behind the rear 8 of the transparent base body 6. The display device is designed in such a way and/or is controlled by means of the control device 5 in such a way that it shows multiple selection regions $A_1$, $A_2$, $A_3$, $A_4$, $A_5$, $A_6$ in the coupling region 9. This is shown by way of example by the letters A, B, C, D, E and F in the view of the front of the transparent base body in FIG. 2. Each of the letters represents a single selection region. The square frame drawn around each of the letters can also be shown or can be omitted. Of course, the representation is not limited to the letters shown. It is possible e.g. for any image, symbols, numbers, multiple letters or text to be displayed.

The coupling region 9 can therefore also be referred to as a display region 9 of the base body 6 in which selectable selection regions are shown in such a way that they can be seen when the front 7 is viewed.

The volume hologram 11 of the coupling region 9 is designed in such a way that each selection region $A_1$-$A_6$ has an assigned coupling section $9_1$, $9_2$, $9_3$, $9_4$, $9_5$ and $9_6$. Each of these coupling sections $9_1$-$9_6$ has an assigned decoupling section $10_1$, $10_2$, $10_3$, $10_4$, $10_5$ and $10_6$, on which the portion of the coupled radiation that was deflected by the applicable coupling section $9_1$-$9_6$ is incident, as indicated by the dashed lines $13_1$, $13_2$, $13_3$, $13_4$, $13_5$ and $13_6$.

Figure 3:
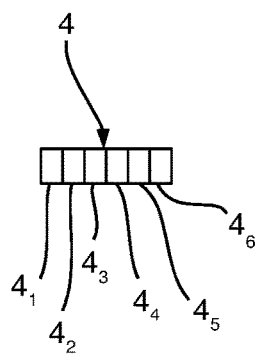
FIG. 3 shows a view of the sensor device 4 of the detector system of FIG. 1.

As shown schematically in FIG. 3, the sensor device 4 is in the form of a line sensor having six sensor sections $4_1$, $4_2$, $4_3$, $4_4$, $4_5$ and $4_6$, each sensor section $4_1$-$4_6$ being assigned to one of the decoupling sections $10_1$-$10_6$. Thus, the radiation decoupled by the decoupling section $10_1$ is incident on the sensor section $4_1$.

The sensor device 4 continuously measures the intensity of the sensor sections $4_1$-$4_6$ and supplies these measurement results to the control device 5, which comprises a processor for carrying out the applicable calculation and control.

If, for example, a user now wants to select the selection region containing the letter A, he can position his finger 14 in front of the front 7 of the base body 6 and in front of the selection region containing the letter A (without touching the front 7), causing a change in the light intensity in front of the coupling section $9_1$ (less light is coupled in via the coupling section $9_1$, since the finger 14 leads to a certain amount of shadowing). As a result of light being coupled in via the applicable coupling section $9_1$ and the coupled-in light $13_1$ being guided as far as the decoupling section $10_1$, which directs the light onto the sensor section $4_1$, the sensor section $4_1$ will measure a lower light intensity and forward this measurement result to the control device 5. Due to the reduced intensity, the control device 5 can ascertain that the selection region containing the letter A has been selected.

A contactless area sensor is thus provided which can be used universally and has low susceptibility to faults even in different lighting conditions.

Figure 16:
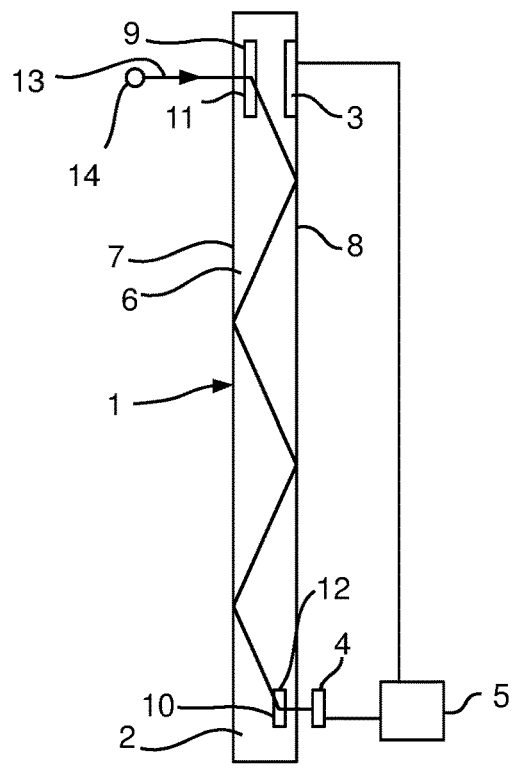
FIG. 16 shows a schematic representation of a further embodiment of the detector system.

The transparent base body 6 can be spaced apart from the display device 3 (also called display apparatus 3 below), as shown schematically in FIG. 1. However, it is also possible for the base body 6 to be connected to the display device 3. In particular, the display device 3 itself can be used as a transparent base body 6. In this case, only the volume holograms 11 and 12 need to be formed in the display device 3, so that the transparent base body 6 is then realized by the display device 3. In particular, the display device 3 can contain an optoelectronic element (for example an LCD element or an OLED element), which is embedded in the base body 6, as shown schematically in FIG. 16. The display devices 3 described so far can therefore also be referred to as active display devices 3.

Figure 17:
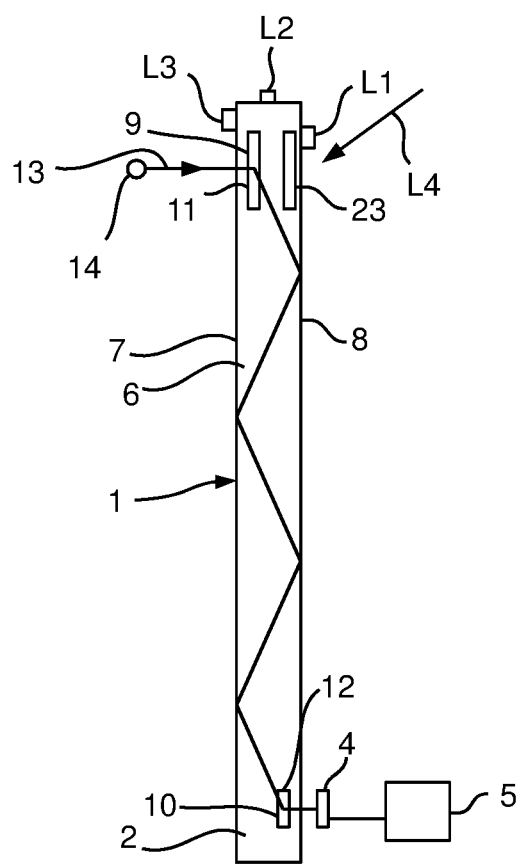
FIG. 17 shows a schematic representation of a further embodiment of the detector system.

It is also possible to use a holographic element 23 (e.g. a holographic diffusing screen) for the display devices 3, which element can also be embedded in the base body 6, as shown schematically in FIG. 17. The holographic element can be used to show dynamic or static content. The illumination (or reconstruction of the hologram as part of the display device 3) can be implemented in various ways. There can thus be provision for active illumination L1-L3, the illumination L1 being arranged on the rear 8, the illumination L2 being arranged on the end and the illumination L3 being arranged on the front 7. Of course, there is preferably provision for only one of the three illuminations L1-L3. Alternatively, the hologram can also be designed in such a way that the illumination is produced using sunlight (indicated by arrow L4). The illumination L1-L3 can be referred to as active illumination and the illumination using sunlight can be referred to as passive illumination.

FIG. 4 describes an embodiment in which there is provision for two lots of six coupling sections $9_1$-$9_6$ and $9_7$, $9_8$, $9_9$, $9_{10}$, $9_{11}$ and $9_{12}$. These two lots of six coupling sections $9_1$-$9_6$ and $9_7$-$9_{12}$ are arranged vertically one above the other (in the direction of propagation). By contrast, the assigned twelve decoupling sections $10_1$-$10_6$ and $10_7$, $10_8$, $10_9$, $10_{10}$, $10_{11}$ and $10_{12}$ are spaced apart from each other in the horizontal direction, as shown in FIG. 4. Arranged behind these two regions of decoupling sections $10_1$-$10_6$ and $10_7$-$10_{12}$ are two regions having six sensor sections each, so that each coupling section $9_1$-$9_{12}$ has an assigned sensor section by way of the decoupling sections $10_1$-$10_{12}$. The decoupling sections $10_1$-$10_6$ and $10_7$-$10_{12}$ are spaced apart from one another in the horizontal direction in order to achieve resolution in the vertical direction (direction of propagation) and to avoid interference for the sections of the volume hologram 11 of the coupling region 9 as far as possible. Therefore, the propagation angles to the decoupling sections $10_1$-$10_{12}$ and thus to the sensor sections of the sensor device 4 from the coupling sections $9_1$-$9_6$ and the coupling sections $9_7$-$9_{12}$, on the other hand, are as different as possible.

In the solution shown in FIG. 4, the decoupling sections $10_1$-$10_{12}$ and thus the sensor sections of the sensor device 4 are formed at different locations on the transparent base body 6. Alternatively, it is possible to select the greatest possible distances for the different vertical input options (coupling sections $9_1$-$9_6$ on the one hand and coupling sections $9_7$-$9_{12}$ on the other hand) within the decoupling sections $10_1$-$10_{12}$. Of course, this then also applies to the sensor sections of the sensor device 4. By comparing the voltage differences on the individual sensor sections, the correct input value can then be reliably identified.

An exemplary embodiment is shown in FIG. 5, in which the sensor device 4 comprises a 2D RGB sensor that is positioned behind the rear 8, as shown in FIG. 6. In this embodiment, the different selection regions in the horizontal direction (double-headed arrow 15) are resolved by way of the propagation angle, as in the embodiment described in connection with FIG. 4. The different selection regions in the vertical direction (double-headed arrow 16) are resolved by way of the wavelengths. In order to achieve this, the volume hologram 11 of the coupling region 9 is manufactured in such a way that it diffracts the incident light according to the position in the horizontal and vertical directions in such a way that for each selection region (and thus for each coupling section $9_1$-$9_{15}$) an accordingly different combination of propagation angle and wavelength occurs for the decoupling region 10, or the decoupling sections $10_1$-$10_{15}$, and thus for the sensor sections of the sensor device 4. The control device 5 can then interpret the applicable values from the sensor device 4.

Figure 7:
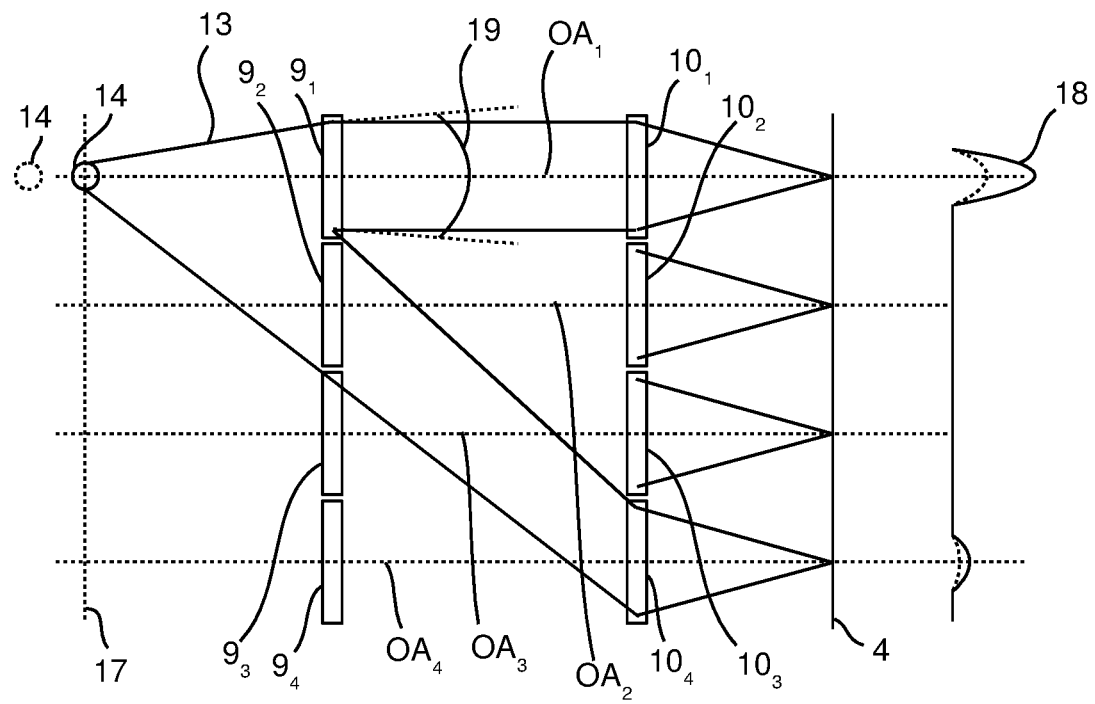
FIG. 7 shows a schematic representation for explaining a further embodiment of the detector system 1; P

In the embodiment shown in FIG. 7, an exposed lens element function is used for input recognition, said function preferably being incorporated in the volume hologram 12 of the decoupling region 10. The selectivity of the object point can be adjusted by way of the exposure of the volume holograms, by exposing a strong angle dependency into the volume hologram 12 of the decoupling region 10. For this purpose, a holographically exposed lens element, the effect of which is indicated in the schematic representation in FIG. 7, is incorporated in each decoupling section $10_1$-$10_{12}$. The focal length of this exposed lens element lies in a focal plane 17 in front of the front 7 of the transparent base body 6 and defines the distance of the object 14 to be detected from the front 7 at which the object 14 is ideally reproduced on the sensor device 4. FIG. 7 also schematically shows the intensity distribution 18 for each decoupling section $10_1$-$10_4$ for the object 14 when positioned within the focal plane 17 (solid line) and when positioned in front of the focal plane 17 (dashed line). Different contrast areas (spots) are thus created on the sensor device 4, which are assigned to the individual selection regions (coupling sections $9_1$-$9_4$). If an object 14 comes close to the focal plane 17, changes in intensity are registered on the sensor device 4. Thus, a spatial resolution of the input can be recognized. By defining a threshold value for the intensity at the focal point, it is possible to make the input for an application. As shown schematically in FIG. 7, the closer the object 14 is to the focal plane 17, the greater the light intensity, or the contrast, on the sensor device 4. The aberrations increase as the distance between the object 14 and the respective optical axis $OA_1$, $OA_2$, $OA_3$ and $OA_4$ increases. Also shown in FIG. 7 is the sensitive angle range 19 of the coupling section $9_1$.

This described change in contrast with distance from the focal plane 17 can also be evaluated in such a way that it results in the distance of the object 14 from the focal plane 17 (and thus also from the front 7) being detected. This change in the distance from the focal plane 17 (or from the front 7) can be used as an input variable for setting a parameter, such as for controlling the volume of an audio output. As such, e.g. the volume can be increased if the object 14 is moved towards the focal plane 17 and the distance from the focal plane 17 thus decreases. Other parameters can also be controlled in this way, such as the brightness of what is shown in the display region or other parameters for the display.

The distance of the object 14 from the front 7 can also be detected by spectral resolution.

Figure 8:
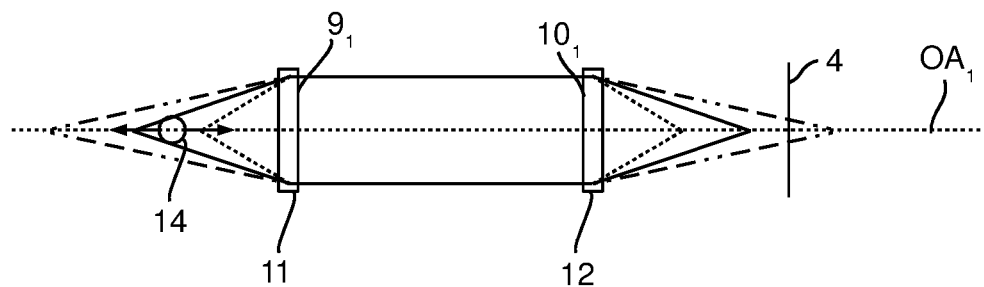
FIG. 8 shows a schematic representation for explaining a further embodiment of the detector system 1.

For this purpose, as shown schematically in FIG. 8, both the volume hologram 11 of the coupling section $9_1$ and the volume hologram 12 of the decoupling section $10_1$ are each formed using a lens element function. Depending on the spectral value, or wavelength, the focal plane of the volume hologram 11 for the coupling section $9_1$ is different distances away from the front 7 of the transparent base body 6. The distance decreases from blue to green to red and infrared (in particular NIR). If the coupling region 9 is actively illuminated and the wavelength of the illumination is known, the focal plane and thus the distance from the front 7 of the transparent base body 6 are also known.

The lens element function in the volume hologram 12 of the decoupling section $10_1$ comprises the same spectral characteristic, which means that the distance from the rear 8 decreases from blue to green to red and infrared.

The sensor device 4 is in the form of a spectrally selective sensor device 4 and can include e.g. an RGB sensor. The control device 5 can then use the intensity values on the basis of the applicable wavelengths to recognize the selection of the applicable coupling section $9_1$. Additionally or alternatively, the distance of the object 14 from the front 7 can be detected, which in turn allows a parameter (such as the volume) to be controlled.

Up to now, the holograms 11 and 12 have always been described as volume holograms. Of course, different types of holograms can be used. In particular, diffractive elements and in particular relief gratings can be used. When using volume gratings and volume holograms, however, there is the advantage of selectivity for angle and wavelength. The filter function thus means that stray light (radiation that is irrelevant to the function of the solution) cannot be coupled in and/or cannot be forwarded to the sensor device 4. This can contribute to higher precision and robustness.

Figure 9:
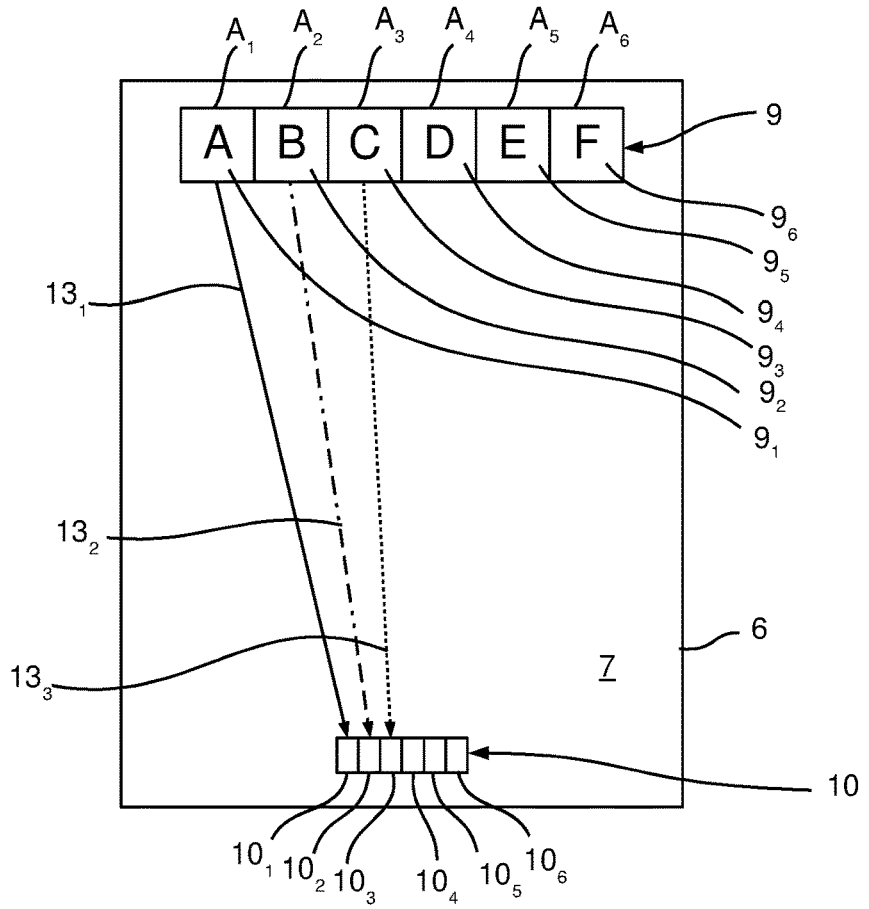
FIG. 9 shows a view of the front 7 of a transparent base body 6 of a further embodiment of the detector system 1.
Figure 10:
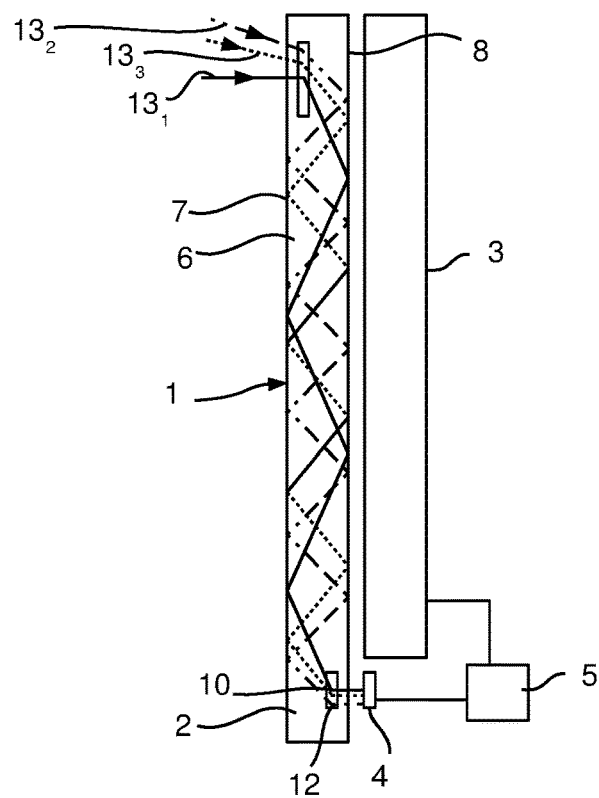
FIG. 10 shows a side view of the detector system 1 of FIG. 9.

In the embodiments described so far, the selection regions A-F can be found next to one another. Interference (e.g. from scattered light) can be reduced if each selection region has a different coupling grating and the propagation angles of adjacent selection regions are chosen to be as different as possible, as is shown schematically below for the selection regions with the letters A, B and C in FIGS. 9 and 10.

A further possibility for reducing interference is described in connection with FIG. 11. Here, the object 14 used to make the input is actively illuminated from the display plane. The reflected light can be captured and used to select the input. This reduces interference caused by possibly unwanted shadowing. Moreover, this allows use in the dark.

Figure 11:
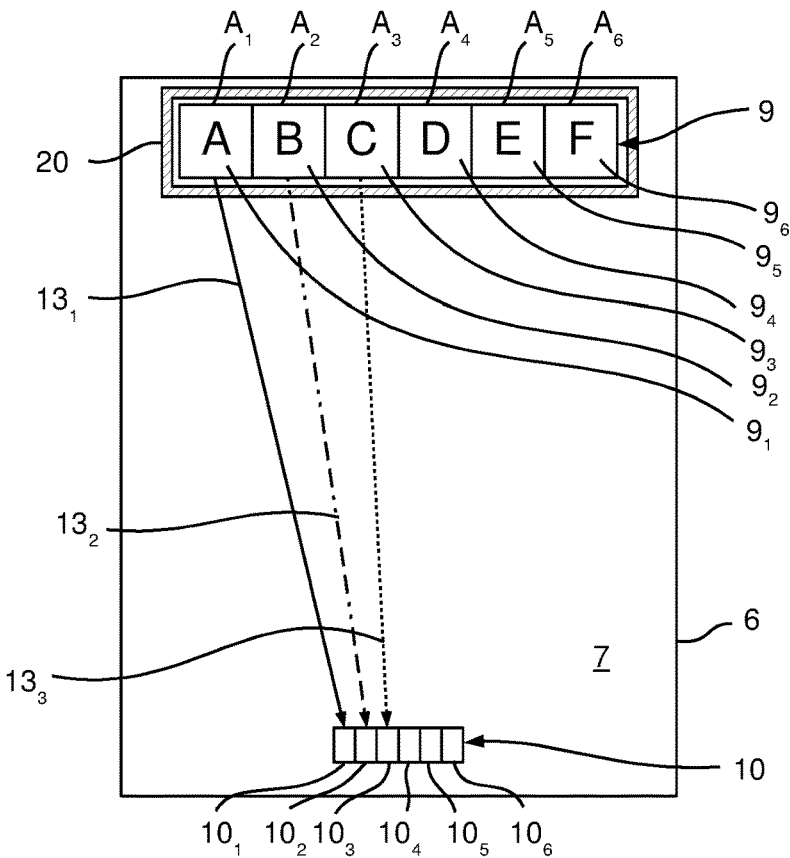
FIG. 11 shows a view of the front 7 of the base body 6 of a further embodiment of the detector system 1.
Figure 12:
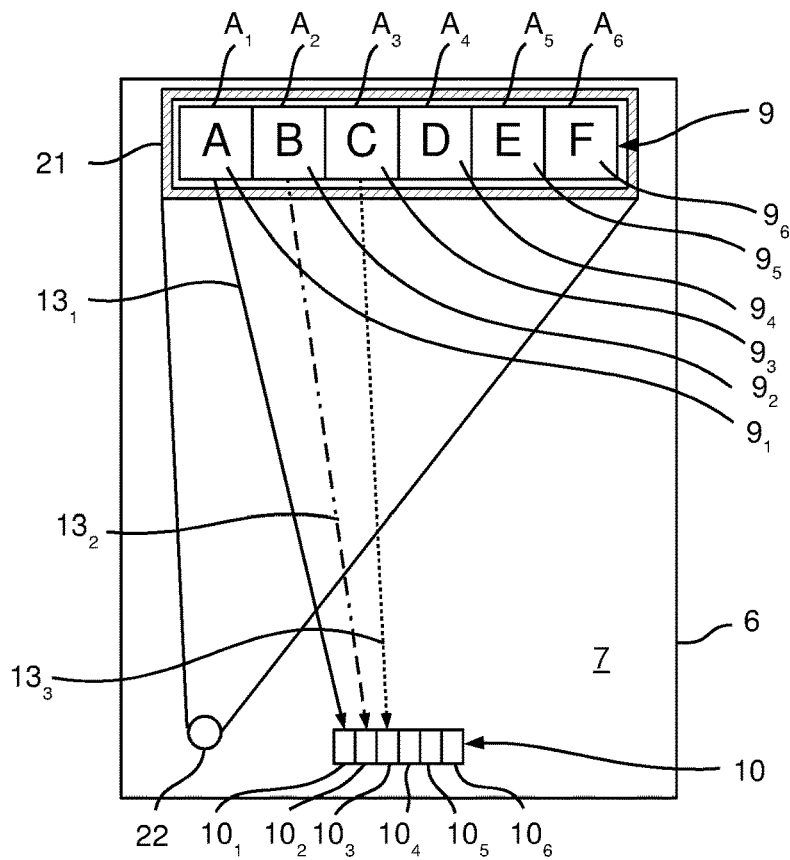
FIG. 12 shows a view of the front 7 of the base body 6 of a further embodiment of the detector system 1.
Figure 13:
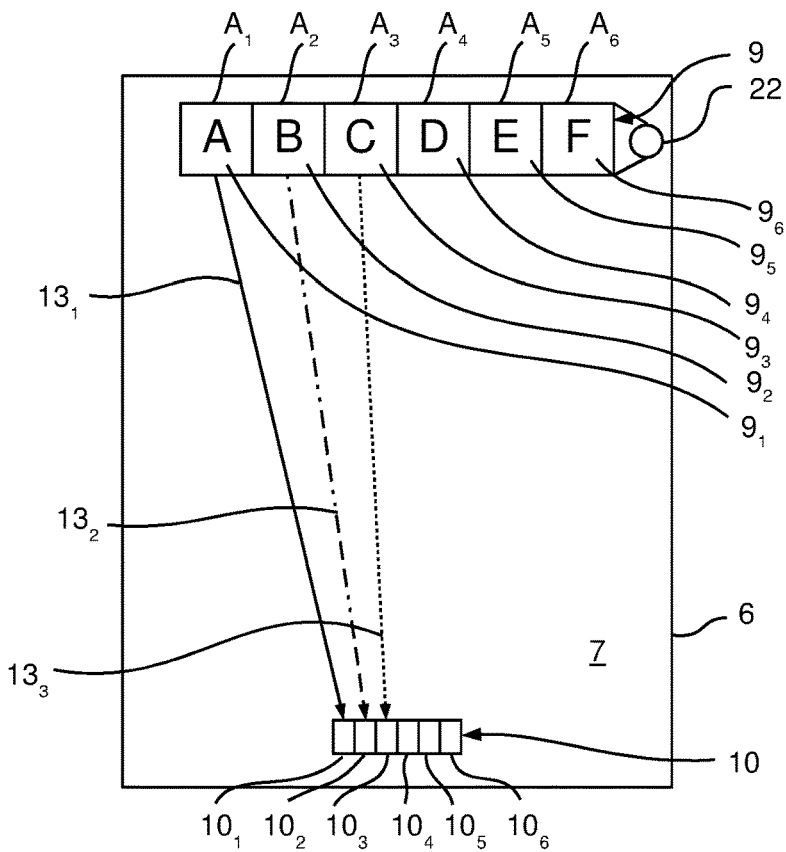
FIG. 13 shows a view of the front 7 of the base body 6 of a further embodiment of the detector system 1.

The active illumination can be implemented e.g. by way of an LED frame 20 around the coupling region 9 (FIG. 11). However, a second hologram 21 around the coupling region 9 (FIG. 12) or under the volume hologram 11 of the coupling region 9 (FIG. 13) can also be used for this purpose, the second hologram 21 being able to decouple white light, for example, which is coupled in by a defined point 22 on the transparent base body 6. It is merely necessary to ensure that the propagating waves of the second hologram 21 and of the volume hologram 11 of the coupling region 9 do not interfere with one another. The illumination function from a micro-optical structure in the transparent base body 6 means that the transparent base body 6 itself can remain transparent.

The active illumination can also take place as a result of illumination of the selection regions on the front 7 from the base body 6. In this case, the source for the coupled-in light can be chosen to be locally different, as is shown schematically in FIG. 13.

Figure 14:
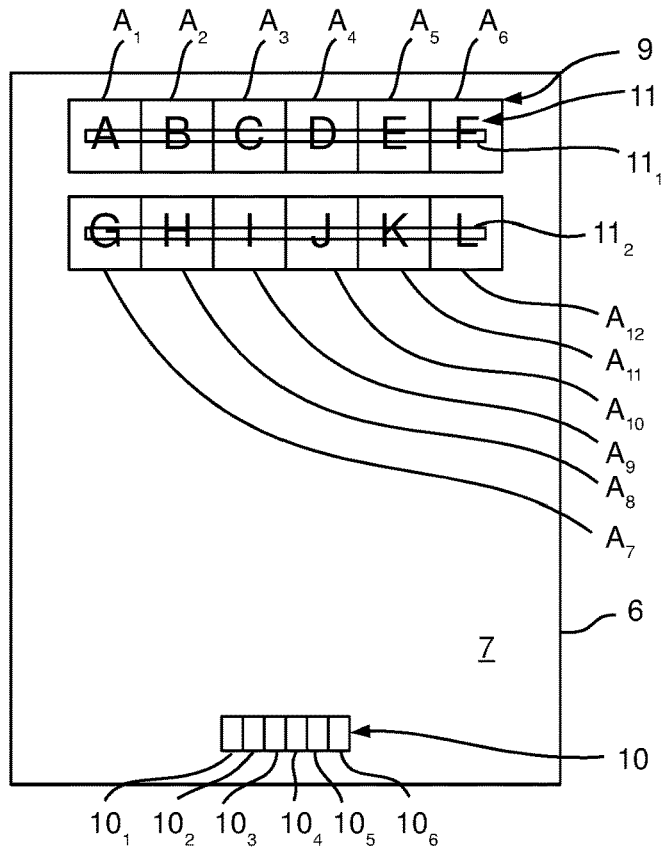
FIG. 14 shows a view of the front 7 of the base body 6 of a further embodiment of the detector system 1.
Figure 15:
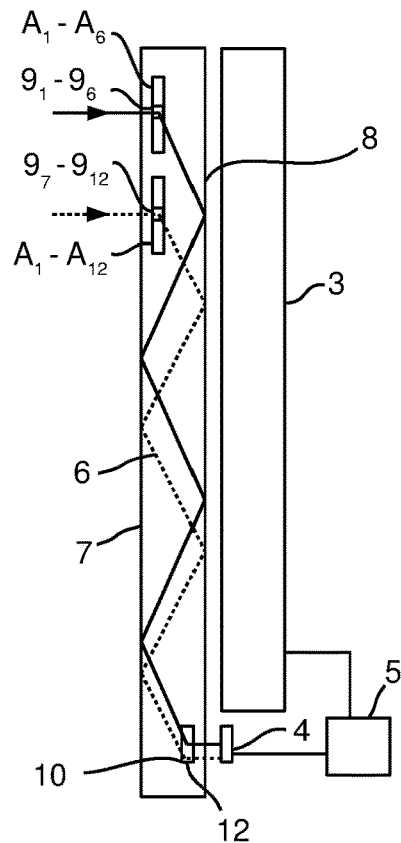
FIG. 15 shows a side view of the detector system 1 of FIG. 14.

In order to optimize the beam guidance and arrangement of the propagation angles, the volume hologram 11 for the coupling region 9 does not have to cover the entire area of the selection regions, but can also be very narrow, as indicated in FIG. 14. For this purpose, a coupling grating 11 exposed to a plane wave can be divided into multiple strips $11_1$, $11_2$, which can then be used for coupling in the respective selection regions in the vertical direction. The purpose of this is that after the beams have been coupled in, they do not strike another coupling grating 11 on their way to the decoupling region 10, since they would otherwise interfere and thus not be able to be resolved again at the sensor device 4. Dividing the coupling grating 11 into coupling strips $11_1$, $11_2$ allows larger areas in the transparent base region 6 to be functionalized and inputs to be read reliably. Furthermore, it becomes easier to find suitable propagation angles for transporting the radiation to the decoupling region 10, and multiple lines in the coupling region 9 can use only one decoupling grating with a photosensitive chip (sensor device 4) for detection.

In order for a complete image to result at the sensor device 4 of the decoupling grating 12 in the embodiment described, the vertical height of the coupling grating 11 may be only the same as that of the sensor device 4. In order to still achieve an optimum resolution for different heights, a lens element function can be exposed into the decoupling grating 12, said function ensuring that the radiation of the individual coupling strips $11_1$, $11_2$ of the coupling grating 11 again is incident on the sensor device 4 as an overall image with the correct scaling via the decoupling grating (as shown schematically in FIG. 16).

In the case of stray light, the detector system 1 described here can result in misinterpretations when evaluating the change in light intensity on the sensor device 4. In order to reduce this, the control device 5 can compare light values of all the selection regions with one another and define non-changing values over the travel time as static values. These values can be ignored when evaluating the changes in intensity. Thus, light values that do not belong to the application can be removed as background noise and the actual calculation of the change in intensity to identify an input becomes more reliable.

Another way of improving the robustness of the detector system 1 is to expose a lens element function on the coupling grating and the decoupling grating. In this way, differences in intensity can be registered much better and incorrect interpretations in the input can be reduced.

Furthermore, an exposed lens element function on the coupling grating allows the light to be guided from the coupling grating to the decoupling grating in parallel, or as a parallel pencil of rays. Less light is thus lost on the way to the sensor device 4 and stray light is reduced.

If a selection region is approached with an object 14, a specific change in light intensity occurs at the decoupling grating in a specific angle range (more light with active illumination; less light with passive illumination). The volume hologram with the lens element function is only efficient for one angle range. A sharp change in intensity occurs on the sensor device for the selection region on the sensor device. Adjacent selection regions achieve little or no changes in intensity on the sensor device, since the angle range is not efficient for them.

While the invention has been described in connection with what is presently considered to be the most practical and preferred embodiments, it will be apparent to those of ordinary skill in the art that the invention is not to be limited to the disclosed embodiments. It will be readily apparent to those of ordinary skill in the art that many modifications and equivalent arrangements can be made thereof without departing from the spirit and scope of the present disclosure, such scope to be accorded the broadest interpretation of the appended claims so as to encompass all equivalent structures and products. Moreover, features or aspects of various example embodiments may be mixed and matched (even if such combination is not explicitly described herein) without departing from the scope of the invention.

The invention claimed is:

1. A contactless detector system, comprising:
 a waveguide, comprising a transparent base body having a front and a rear;
 a display device that shows multiple selection regions such that they can be seen in a display region of the base body when the front is viewed;
 a sensor device comprising an assigned sensor section for each selection region; and
 a control device,
 wherein the base body includes a diffractive element in the display region and a decoupling region that is spaced apart from the display region and comprises an assigned decoupling section for each selection region,
 wherein at least a portion of radiation that is incident on the diffractive element in the display region via the front is deflected via the diffractive element on the basis of the selection region such that the deflected portion propagates as coupled-in radiation in the base body by reflection as far as the decoupling region and is incident on the assigned decoupling section of the decoupling region,
 wherein the decoupling region decouples at least a portion of the coupled-in radiation that is incident on the decoupling region from the base body such that the portion decoupled by a decoupling section is incident on the assigned sensor section of the sensor device, which section continuously measures the intensity of the incident radiation and supplies it to the control device, and
 wherein the control device is configured to take a change in intensity caused by an object being positioned contactlessly in front of the front of the base body and in front of a selection region of the display region as a basis for determining whether the selection region has been selected.

2. The detector system of claim 1, wherein the diffractive element is a volume hologram.

3. The detector system of claim 1, wherein the diffractive element comprises a lens element function.

4. The detector system of claim 3, wherein the lens element function of the diffractive element is configured to propagate the coupled-in radiation in the base body as a parallel pencil of rays.

5. The detector system of claim 1, wherein the decoupling region comprises a volume hologram.

6. The detector system of claim 1, wherein the decoupling region comprises a lens element function.

7. The detector system of claim 1, wherein the deflection via the diffractive element on the basis of the selection region differs by different propagation angles within the transparent base body and/or different deflected wavelengths.

8. The detector system of claim 1, wherein the diffractive element for each selection region comprises a coupling section that has a smaller two-dimensional extent than the assigned selection region.

9. The detector system of claim 1, comprising an illumination device that actively illuminates the object to be positioned in front of the front.

10. The detector system of claim 9, wherein the illumination device is configured to illuminate the object from the base body.

11. The detector system of claim 1, wherein the control device takes the measured intensity as a basis for ascertaining the distance of the object from the front of the transparent base body.

12. The detector system as claimed in claim 1, wherein the control device takes the determined selection region as a basis for controlling the display device such that the display device changes its display, and/or changes the value of a measurement parameter and output parameter.

13. A contactless detector system, comprising:
 a waveguide, comprising a transparent base body having a front and a rear;
 a display device that shows multiple selection regions such that they can be seen in a display region of the base body when the front is viewed;
 a sensor device comprising an assigned sensor section for each selection region; and
 a control device,
 wherein the base body includes a diffractive element in the display region and a decoupling region that is spaced apart from the display region and comprises an assigned decoupling section for each selection region,
 wherein at least a portion of radiation that is incident on the diffractive element in the display region via the front is deflected via the diffractive element on the basis of the selection region such that the deflected portion propagates as coupled-in radiation in the base body by reflection as far as the decoupling region and is incident on the assigned decoupling section of the decoupling region,
 wherein the decoupling region decouples at least a portion of the coupled-in radiation that is incident on the decoupling region from the base body such that the portion decoupled by a decoupling section is incident on the assigned sensor section of the sensor device, which section continuously measures the intensity of the incident radiation and supplies it to the control device,
 wherein the control device is configured to take a change in intensity caused by an object being positioned contactlessly in front of the front of the base body and in front of a selection region of the display region as a basis for determining whether the selection region has been selected, and wherein the control device takes the measured intensity as a basis for ascertaining the distance of the object from the transparent base body.

\* \* \* \* \*